United States Patent
Khlat (10) Patent No.: US 10,862,431 B1
(45) Date of Patent: Dec. 8, 2020

(54) ENVELOPE TRACKING AMPLIFICATION ARCHITECTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 16/804,580

(22) Filed: Feb. 28, 2020

Related U.S. Application Data (60) Provisional application No. 62/854,598, filed on May 30, 2019.

(51) Int. Cl.
*H03F 1/02* (2006.01)
*H03F 3/24* (2006.01)
*H03F 3/195* (2006.01)
*H04B 1/04* (2006.01)

(52) U.S. Cl.
CPC .......... *H03F 1/0227* (2013.01); *H03F 3/195* (2013.01); *H03F 3/245* (2013.01); *H04B 1/0475* (2013.01); *H03F 2200/12* (2013.01); *H03F 2200/451* (2013.01)

(58) Field of Classification Search
CPC ........ H03F 1/0227; H03F 3/195; H03F 3/245; H03F 2200/12; H03F 2200/451; H04B 1/0475
See application file for complete search history.

(56) References Cited

U.S. PATENT DOCUMENTS

| | | | | |
|---|---|---|---|---|
| 7,679,433 B1* | 3/2010 | Li | .......... | H03F 1/0244 330/10 |
| 2003/0198300 A1* | 10/2003 | Matero | ................. | H04L 27/368 375/297 |
| 2011/0221523 A1* | 9/2011 | Dupis | ................. | H03G 3/3047 330/129 |
| 2015/0097625 A1* | 4/2015 | Ul Haq | .................. | H03F 3/245 330/297 |

* cited by examiner

Primary Examiner — Freshten N Aghdam
(74) Attorney, Agent, or Firm — Withrow & Terranova, P.L.L.C.

(57) ABSTRACT

The present disclosure relates to an envelope tracking (ET) amplification architecture, which includes a power amplifier (PA) block configured to amplify a radio frequency (RF) input signal and provide an RF output signal, and an ET voltage block configured to provide modulated voltages to the PA block as power supplies. Herein, the modulated voltages are provided based on a configuration of the PA block and from one pulsed ramp signal, which contains envelope information of the RF input signal. The modulated voltages are eligible to have at least one of a time delay difference, an amplitude difference, and a phase difference.

20 Claims, 5 Drawing Sheets

ENVELOPE TRACKING AMPLIFICATION ARCHITECTURE

RELATED APPLICATIONS

This application claims the benefit of provisional patent application Ser. No. 62/854,598, filed May 30, 2019, the disclosure of which is hereby incorporated herein by reference in its entirety.

FIELD OF THE DISCLOSURE

The technology of the disclosure relates generally to an envelope tracking (ET) amplification architecture in a wireless communication device.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) and sixth-generation. To achieve the higher data rates in mobile communication devices, sophisticated power amplifiers (PAs) may be employed in a radio frequency (RF) front-end circuit to increase output power of RF signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of PAs to help reduce power consumption and thermal dissipation in the mobile communication device. With ET power management technology, a PA amplifies the RF signals based on time-variant voltages generated in accordance to time-variant amplitudes of the RF signals. The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signals. In this regard, it may be necessary to constantly adjust the time-variant voltages applied to the PA to ensure that the PA can consistently operate at a desired efficiency for any given instantaneous power requirement of the RF signals. In some applications, multiple PAs may desire more than one time-variant voltage to further improve the efficiency levels of the PAs.

SUMMARY

The present disclosure relates to an envelope tracking (ET) amplification architecture, which includes a signal processing unit, a first tracking amplifier coupled to a first voltage port, a second tracking amplifier coupled to a second voltage port, and a power amplifier (PA) block. The signal processing unit is configured to generate a first target voltage and a second target voltage from one pulsed ramp signal and based on a configuration of the PA block. The first tracking amplifier is configured to generate a first tracked voltage based on the first target voltage, and the second tracking amplifier is configured to generate a second tracked voltage based on the second target voltage. Herein, a first modulated voltage at the first voltage port is related to the first tracked voltage, and a second modulated voltage at the second voltage port is related to the second tracked voltage. The PA block is coupled to the first voltage port via a first supply line to receive the first modulated voltage, and is coupled to the second voltage port via a second supply line to receive the second modulated voltage. The second modulated voltage is not smaller than the first modulated voltage over time.

In one embodiment of the ET amplification architecture, the PA block is configured to amplify a radio frequency (RF) input signal and provide an RF output signal. Herein, the pulsed ramp signal contains envelope information of the RF input signal. The PA block includes a first stage amplifier and a second stage amplifier coupled in series, such that the first stage amplifier is configured to receive the RF input signal, and the second stage amplifier is configured to provide the RF output signal. The first stage amplifier is coupled to the first voltage port via the first supply line to receive the first modulated voltage for power supply, while the second stage amplifier is coupled to the second voltage port via the second supply line to receive the second modulated voltage for power supply.

In one embodiment of the ET amplification architecture, the PA block further includes an isolation element coupled between the first stage amplifier and the second stage amplifier. The isolation element is configured to reduce RF coupling from the second stage amplifier to the first stage amplifier.

In one embodiment of the ET amplification architecture, the PA block further includes a first choke inductor and a second choke inductor. Herein, the first choke inductor is coupled between the first stage amplifier and the first supply line, such that the first modulated voltage drops a first voltage distortion over the first choke inductor and the first supply line. The second choke inductor is coupled between the second stage amplifier and the second supply line, such that the second modulated voltage drops a second voltage distortion over the second choke inductor and the second supply line. The signal processing unit is configured to generate the first target voltage to compensate the first voltage distortion from the first modulated voltage, and configured to generate the second target voltage to compensate the second voltage distortion from the second modulated voltage.

In one embodiment of the ET amplification architecture, the signal processing unit includes a split element, a first equalizer, and a second equalizer. The split element is configured to split the pulsed ramp signal into a first split signal and a second split signal. The first split signal and the second split signal are eligible to have different amplitude ranges. The first equalizer is configured to adjust the first split signal to provide a first equalized signal, and the second equalizer is configured to adjust the second split signal to provide a second equalized signal. Herein, the first target voltage is based on the first equalized signal that is adjusted to compensate the first voltage distortion from the first modulated voltage. The second target voltage is based on the second equalized signal that is adjusted to compensate the second voltage distortion from the second modulated voltage.

In one embodiment of the ET amplification architecture, the signal processing unit includes a split element, a first equalizer, and a second equalizer. The split element is configured to split the pulsed ramp signal into a first split signal and a second split signal. The first split signal and the second split signal are eligible to have different amplitude ranges. The first equalizer is configured to adjust the first split signal based on the configuration of the PA block to provide a first equalized signal, and the second equalizer is configured to adjust the second split signal based on the configuration of the PA block to provide a second equalized signal. Herein, the first target voltage is based on the first equalized signal and the second target voltage is based on the second equalized signal. The first target voltage and the second target voltage are eligible to have at least one of a time delay difference, an amplitude difference, and a phase difference.

In one embodiment of the ET amplification architecture, the signal processing unit further includes a first anti-aliasing filter (AAF) coupled to the first equalizer and a second AAF coupled to the second equalizer. As such, the first AAF is configured to low-pass filter the first equalized signal to provide the first target voltage, and the second AAF is configured to low-pass filter the second equalized signal to provide the second target voltage.

According to another embodiment, the ET amplification architecture further includes a multi-level voltage converter with a charge pump and a low-dropout (LDO)/switch unit coupled between the first voltage port and the second voltage port. Herein, the charge pump is configured to receive a battery voltage and generate a boosted voltage higher than the battery voltage. An output current is induced based on the boosted voltage. A first portion of the output current is eligible to flow through the LDO/switch unit from the second voltage port to the first voltage port, and a second portion of the output current is eligible to flow towards the second voltage port.

According to another embodiment, the ET amplification architecture further includes an isolation inductor coupled between the second voltage port and the LDO/switch unit. The isolation inductor is configured to provide RF isolation between the first voltage port and the second voltage port.

According to another embodiment, the ET amplification architecture further includes a power inductor coupled between the multi-level voltage converter and the second voltage port. The power inductor is configured to induce the output current based on the boosted voltage.

According to another embodiment, the ET amplification architecture further includes a first control unit and a second control unit. The second control unit is configured to control the multi-level voltage converter to increase or decrease the output current. The first control unit is configured to control the LDO/switch unit to increase or decrease the first portion of the output current from the second voltage port to the first voltage port.

In one embodiment of the ET amplification architecture, the LDO/switch unit is implemented by a transistor. Herein, a drain of the transistor is coupled to the second voltage port, a source of the transistor is coupled to the first voltage port, and the first control unit is configured to control a gate of the transistor to increase or decrease the first portion of the output current from the second voltage port to the first voltage port.

In one embodiment of the ET amplification architecture, the first control unit is one of a group consisting of a microprocessor, a microcontroller, a digital signal processor (DSP), and a field programmable gate array (FPGA), and the second control unit is one of a group consisting of a microprocessor, a microcontroller, a DSP, and a FPGA.

In one embodiment of the ET amplification architecture, the first tracking amplifier is coupled to the first voltage port via a first offset capacitor, and the second tracking amplifier is coupled to the second voltage port via a second offset capacitor. Herein, the first modulated voltage at the first voltage port is equal to the first tracked voltage generated by the first tracking amplifier and a first offset voltage across the first offset capacitor. The second modulated voltage at the second voltage port is equal to the second tracked voltage generated by the second tracking amplifier and a second offset voltage across the second offset capacitor.

In one embodiment of the ET amplification architecture, the second control unit is configured to control the charge pump by comparing the second tracked voltage from the second tracking amplifier and the second modulated voltage at the first voltage port. The first control unit is configured to control the LDO/switch unit by comparing the first tracked voltage from the first tracking amplifier and the first modulated voltage at the first voltage port.

In one embodiment of the ET amplification architecture, the multi-level voltage converter further includes a switch structure coupled between the charge pump and the power inductor. Herein, the second control unit is configured to control duty cycles of the charge pump in the multi-level voltage converter to change a value of the boosted voltage. The switch structure is controlled by the second control unit to selectively output the boosted voltage from the charge pump, the battery voltage, or zero voltage from ground to the power inductor, so as to control the output current towards the second voltage port.

According to another embodiment, the ET amplification architecture further includes a demultiplexer (DEMUX) coupled between the first control unit and the LDO/switch unit, and a multiplexer (MUX) coupled between the second control unit and the charge pump. Herein, the DEMUX is configured to receive a first control signal from the first control unit, and configured to provide the first control signal either to the LDO/switch unit or to the MUX. The MUX is configured to receive either the first control signal from the DEMUX or a second control signal from the second control unit, and configured to provide the received control signal to the charge pump.

In one embodiment of the ET amplification architecture, the boosted voltage is equal to two times the battery voltage.

According to another embodiment, an alternative ET amplification architecture includes a PA block, a displaced amplifier (DA) unit disposed close to the PA block, and an envelope tracking integrated circuit (ETIC) unit with a charge pump disposed away from the PA block. The DA unit includes a signal processing unit, a first tracking amplifier, a second tracking amplifier, and a LDO/switch unit. Herein, the signal processing unit is configured to generate a first target voltage and a second target voltage from one pulsed ramp signal and based on a configuration of the PA block. The first tracking amplifier is coupled to a first voltage port and configured to generate a first tracked voltage based on the first target voltage, while the second tracking amplifier is coupled to a second voltage port and configured to generate a second tracked voltage based on the second target voltage. A first modulated voltage at the first voltage port is related to the first tracked voltage, and a second modulated voltage at the second voltage port is related to the second tracked voltage. The LDO/switch unit is coupled between the first voltage port and the second voltage port. The ETIC unit is configured to receive a battery voltage and generate a boosted voltage higher than the battery voltage. An output current based on the boosted voltage is induced. A first portion of the output current is eligible to flow through the LDO/switch unit from the second voltage port to the first voltage port, and a second portion of the output current is eligible to towards the second voltage port. The PA block is coupled to the first voltage port to receive the first modulated voltage, and coupled to the second voltage port to receive the second modulated voltage. Herein, the second modulated voltage is not smaller than the first modulated voltage over time. The signal processing unit is configured to generate the first target voltage and the second target voltage based on a configuration of the PA block.

In one embodiment of the alternative ET amplification architecture, the DA unit further includes a local DA control element, and the ETIC unit further includes an ETIC control element. Herein, the local DA control element is configured to provide a feedback signal to the ETIC control element by comparing the second tracked voltage with the second modulated voltage. The ETIC control element is configured to control duty cycles of the charge pump to change a value of the boosted voltage based on the feedback signal from the local DA control element.

In one embodiment of the alternative ET amplification architecture, the PA block is configured to amplify an RF input signal and provide an RF output signal. Herein, the pulsed ramp signal contains envelope information of the RF input signal. The PA block includes a first stage amplifier and a second stage amplifier coupled in series, such that the first stage amplifier is configured to receive the RF input signal, and the second stage amplifier is configured to provide the RF output signal. The first stage amplifier is coupled to the first voltage port via a first supply line to receive the first modulated voltage for power supply, while the second stage amplifier is coupled to the second voltage port via a second supply line to receive the second modulated voltage for power supply.

In one embodiment of the alternative ET amplification architecture, the PA block further includes a first choke inductor and a second choke inductor. Herein, the first choke inductor is coupled between the first stage amplifier and the first supply line, such that the first modulated voltage drops a first voltage distortion over the first choke inductor and the first supply line. The second choke inductor is coupled between the second stage amplifier and the second supply line, such that the second modulated voltage drops a second voltage distortion over the second choke inductor and the second supply line. The signal processing unit is configured to generate the first target voltage to compensate the first voltage distortion from the first modulated voltage, and configured to generate the second target voltage to compensate the second voltage distortion from the second modulated voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-4 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
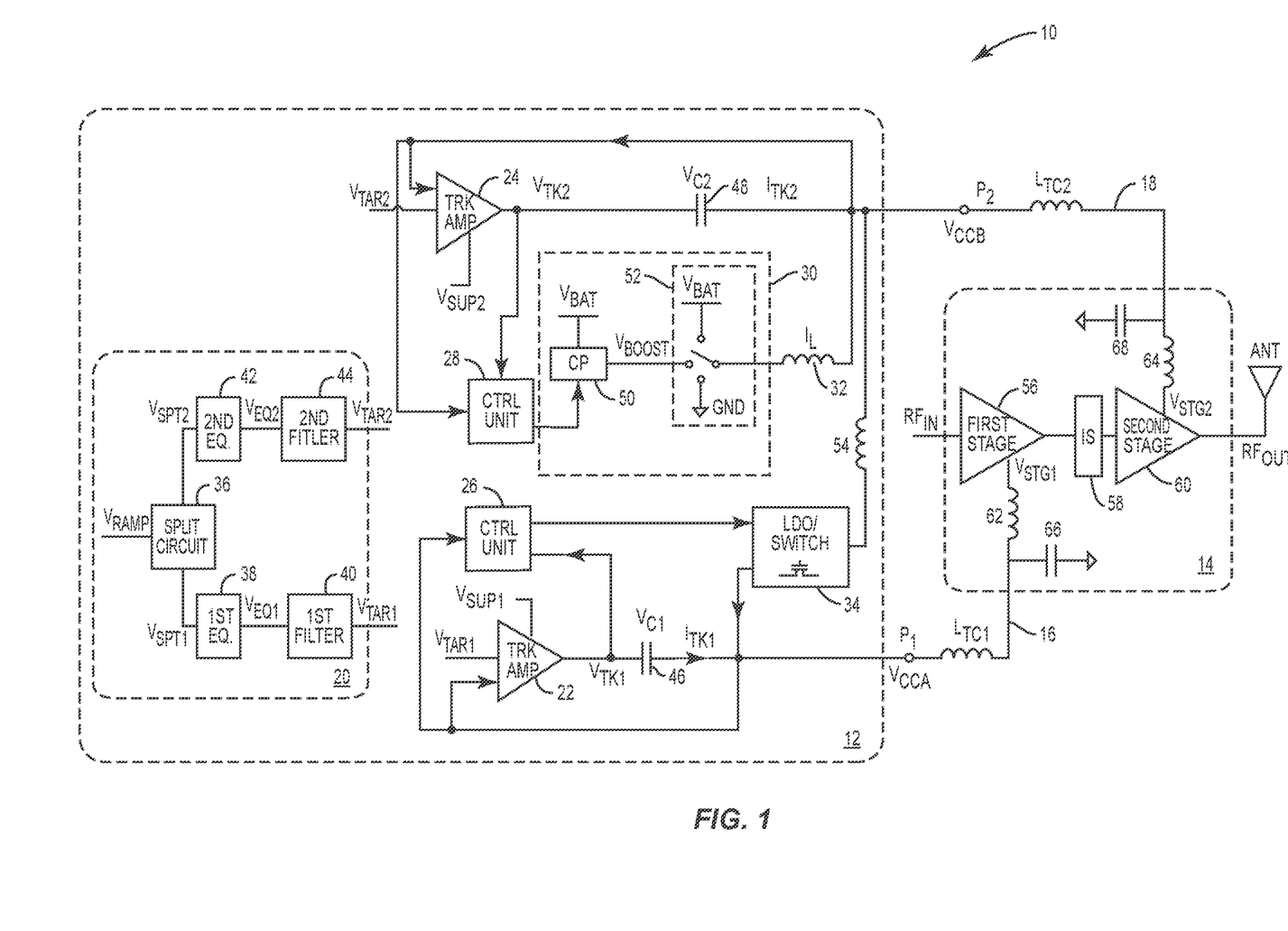
FIG. 1 illustrates an exemplary envelop tracking (ET) amplification architecture according to one embodiment of the present disclosure.

The present disclosure relates to an envelope tracking (ET) amplification architecture within in a wireless communication device. An exemplary ET amplification architecture 10, which includes an ET voltage block 12 and a power amplifier (PA) block 14, is illustrated in FIG. 1 according to an embodiment of the present disclosure. Herein, the ET voltage block 12 is configured to provide a first modulated voltage $V_{CCA}$ and a second modulated voltage $V_{CCB}$ at a first voltage port P1 and a second voltage port P2, respectively, from one pulsed ramp signal $V_{RAMP}$. The pulsed ramp signal $V_{RAMP}$ contains voltage modulation information related to a radio frequency input ($RF_{IN}$) signal applied to the PA block 14, such as envelope information of the $RF_{IN}$ signal. Herein, the first modulated voltage $V_{CCA}$ and the second modulated voltage $V_{CCB}$ provide power supplies to the PA block 14. The first modulated voltage $V_{CCA}$ is fed to the PA block 14 through a first supply line 16, which may inherently have a first trace inductance $L_{TC1}$. The second modulated voltage $V_{CCB}$ is fed to the PA block 14 through a second supply line 18, which may inherently have a second trace inductance $L_{TC2}$.

The ET voltage block 12 includes a signal processing unit 20, a first tracking amplifier 22, a second tracking amplifier 24, a first control unit 26, a second control unit 28, a multi-level voltage converter 30, a power inductor 32, and a low-dropout (LDO)/switch unit 34. In detail, the signal processing unit 20 is configured to receive the pulsed ramp signal $V_{RAMP}$ and provide a first target voltage $V_{TAR1}$ and a second target voltage $V_{TAR2}$ to the first tracking amplifier 22 and the second tracking amplifier 24 as input signals, respectively. Herein, the pulsed ramp signal $V_{RAMP}$ may be a differential signal and varied with time, while the first target voltage $V_{TAR1}$ and the second target voltage $V_{TAR2}$ may be single-end signals. In different applications (e.g. different types of power amplifiers in the PA block 14), the signal processing unit 20 may be programmable, such that the first target voltage $V_{TAR1}$ and the second target voltage $V_{TAR2}$ may have time delay differences, amplitude differences, and/or phase differences over time (more details are described later). For one instance, the pulsed ramp signal $V_{RAMP}$ is a differential sine wave signal, the second target voltage $V_{TAR2}$ is a single-end version of the pulsed ramp signal $V_{RAMP}$ (ranging from 1 V-5 V), and the first target voltage $V_{TAR1}$ is a regulated version of the second target voltage $V_{TAR2}$ (ranging from 0.8 V-3 V). In addition, the second target voltage $V_{TAR2}$ may have time delays compared to the first target voltage $V_{TAR1}$.

In one embodiment, the signal processing unit 20 may include a split element 36, a first equalizer 38, a first anti-aliasing filter (AAF) 40, a second equalizer 42, and a second AAF 44. The split element 36 is configured to split the pulsed ramp signal $V_{RAMP}$ into a first split signal $V_{SPT1}$ and a second split signal $V_{SPT2}$, which may be differential sine wave signals. Note that the first split signal $V_{SPT1}$ and the second split signal $V_{SPT2}$ may have different amplitude ranges, such that the first target voltage $V_{TAR1}$ and the second target voltage $V_{TAR2}$ produced by the signal processing unit 20 may have different amplitude ranges (more details are described later).

The first equalizer 38 may include one or more time delay elements (not shown), one or more phase shifters (not shown), and/or one or more amplitude adjustors (not shown). The first equalizer 38 is configured to adjust the time delay, the phase, and/or the amplitude of the first split signal $V_{SPT1}$ to provide a first equalized signal $V_{EQ1}$. The first equalized signal $V_{EQ1}$ may be a single-end version signal. The first AAF 40 is driven by the first equalizer 38, and configured to low-pass filter the first equalized signal $V_{EQ1}$ to provide the first target voltage $V_{TAR1}$. Similarly, the second equalizer 42 may also include one or more time delay elements (not shown), one or more phase shifters (not shown), and/or one or more amplitude adjustors (not shown). The second equalizer 42 is configured to adjust the time delay, the phase, and/or the amplitude of the second split signal $V_{SPT2}$ to provide a second equalized signal $V_{EQ2}$. The second equalized signal $V_{EQ2}$ may be a single-end version signal. The second AAF 44 is driven by the second equalizer 42, and configured to low-pass filter the second equalized signal $V_{EQ2}$ to provide the second target voltage $V_{TAR2}$.

Each equalizer 38/42 is configured to adjust its corresponding split signal $V_{SPT1}$/$V_{SPT2}$ based on a configuration of the PA block 14 (more details are described later). In one embodiment, the first equalizer 38 and the second equalizer 42 may have different adjustments in time delays, phases, and/or amplitude compensations. As such, the first equalized signal $V_{EQ1}$ and the second equalized signal $V_{EQ2}$ may have different time delays, phases, and/or amplitudes. In consequence, the first target voltage $V_{TAR1}$ (a filtered version of the first equalized signal $V_{EQ1}$) and the second target voltage $V_{TAR2}$ (a filtered version of the second equalized signal $V_{EQ2}$) may have different time delays, phases, and/or amplitudes.

The first tracking amplifier 22 receives a first supply voltage $V_{SUP1}$ as a power supply, and is configured to provide a first tracked voltage $V_{TK1}$ by tracking the first target voltage $V_{TAR1}$. The first supply voltage $V_{SUP1}$ is no smaller than the first target voltage $V_{TAR1}$ over time to ensure proper operation of the first tracking amplifier 22. As such, the first supply voltage $V_{SUP1}$ is no smaller than the first tracked voltage $V_{TK1}$, which tracks the first target voltage $V_{TAR1}$. In a non-limiting example, the first tracking amplifier 22 is coupled to the first voltage port P1 via a first offset capacitor 46, which is configured to provide a first offset voltage $V_{C1}$. The first offset voltage $V_{C1}$, which may be 1 V for example, may help raise the first tracked voltage $V_{TK1}$ to the first modulated voltage $V_{CCA}$ ($V_{CCA}=V_{TK1}+V_{C1}$) at the first voltage port P1, thus helping to lower the first supply voltage $V_{SUP1}$ required by the first tracking amplifier 22 to improve power efficiency in the ET voltage block 12.

If the first tracking amplifier 22 is coupled directly to the first voltage port P1 without the first offset capacitor 46, then the first modulated voltage $V_{CCA}$ will be the same as the first tracked voltage $V_{TK1}$. In this regard, if the first modulated voltage $V_{CCA}$ at the first voltage port P1 is required to be 5 V for example, the first tracked voltage $V_{TK1}$ produced by the first tracking amplifier 22 will also be 5 V. Accordingly, the first supply voltage $V_{SUP1}$ needs to be at least 5 V. In contrast, if the first tracking amplifier 22 is coupled to the first voltage port P1 via the first offset capacitor 46 that provides the 1 V first offset voltage $V_{C1}$, then the first tracking amplifier 22 would only need to produce the first tracked voltage $V_{TK1}$ at 4 V. As a result, the first supply voltage $V_{SUP1}$ may be reduced to 4 V as well, thus helping improve power efficiency in the ET voltage block 12. In one example, the first tracking amplifier 22 may be configured to generate the first tracked voltage $V_{TK1}$ as a first envelope tracking (ET) voltage based on the first target voltage $V_{TAR1}$.

In addition, the first tracking amplifier 22 sources a first tracked current $I_{TK1}$ to the first voltage port P1 through the first offset capacitor 46. Since the first offset capacitor 46 may block direct current (DC) and/or low-frequency alternating current (AC), the first tracked current $I_{TK1}$ from the first tracking amplifier 22 to the first voltage port P1 may only include middle and/or high frequency AC portions. As such, the first tracking amplifier 22 may only provide middle and/or high frequency power energy to the first voltage port P1.

Similarly, the second tracking amplifier 24 receives a second supply voltage $V_{SUP2}$ as a power supply, and is configured to provide a second tracked voltage $V_{TK2}$ by tracking the second target voltage $V_{TAR2}$. The second supply voltage $V_{SUP2}$ is no smaller than the second target voltage $V_{TAR2}$ over time to ensure proper operation of the second tracking amplifier 24. As such, the second supply voltage $V_{SUP2}$ is no smaller than the second tracked voltage $V_{TK2}$, which tracks the second target voltage $V_{TAR2}$. Herein, since the first target voltage $V_{TAR1}$ and the second target voltage $V_{TAR2}$ may have different time delays, different amplitudes, and/or different phases, the first tracked voltage $V_{TK1}$ and the second tracked voltage $V_{TK2}$ based on the first target voltage $V_{TAR1}$ and the second target voltage $V_{TAR2}$, respectively, may also have different time delays, different amplitudes, and/or different phases.

In a non-limiting example, the second tracking amplifier 24 is coupled to the second voltage port P2 via a second offset capacitor 48, which is configured to provide a second offset voltage $V_{C2}$. The second offset voltage $V_{C2}$, which may be 1 V for example, may help raise the second tracked voltage $V_{TK2}$ to the second modulated voltage $V_{CCB}$ ($V_{CCB}=V_{TK2}+V_{C2}$) at the second voltage port P2, thus helping lower the second supply voltage $V_{SUP2}$ required by the second tracking amplifier 24 to improve power efficiency in the ET voltage block 12. If the second tracking amplifier 24 is coupled directly to the second voltage port P2 without the second offset capacitor 48, then the second modulated voltage $V_{CCB}$ will be the same as the second tracked voltage $V_{TK2}$. In this regard, if the second modulated voltage $V_{CCB}$ at the second voltage port P2 is required to be 3 V for example, the second tracked voltage $V_{TK2}$ produced by the second tracking amplifier 24 will also be 3 V. Accordingly, the second supply voltage $V_{SUP2}$ needs to be at least 3 V. In contrast, if the second tracking amplifier 24 is coupled to the second voltage port P2 via the second offset capacitor 48 that provides the 1 V second offset voltage $V_{C2}$, then the second tracking amplifier 24 would only need to produce the second tracked voltage $V_{TK2}$ at 2 V. As a result, the second supply voltage $V_{SUP2}$ may be reduced to 2 V as well, thus helping to improve power efficiency in the ET voltage block 12. In one example, the second tracking amplifier 24 may be configured to generate the second tracked voltage $V_{TK2}$ as a second ET voltage based on the second target voltage $V_{TAR2}$.

In some applications, the first supply voltage $V_{SUP1}$ for the first tracking amplifier 22 and the second supply voltage $V_{SUP2}$ for the second tracking amplifier 24 may have a same or different value. In one embodiment, the second supply voltage $V_{SUP2}$ may be no smaller than the first supply voltage $V_{SUP1}$ over time. In addition, the second tracking amplifier 24 sources a second tracked current $I_{TK2}$ to the second voltage port P2 through the second offset capacitor 48. Since the second offset capacitor 48 may block DC and/or low-frequency AC, the second tracked current $I_{TK2}$ from the second tracking amplifier 24 to the second voltage port P2 may only include middle and/or high frequency AC portions. As such, the second tracking amplifier 24 may only provide middle and/or high frequency power energy to the second voltage port P2.

Each control unit 26/28 may be a microprocessor, a microcontroller, a digital signal processor (DSP), and a field programmable gate array (FPGA), for example. The multi-level voltage converter 30 includes a charge pump 50 and a switch structure 52. Herein, the charge pump 50 is configured to provide a boosted voltage $V_{BOOST}$ based on a battery voltage $V_{BAT}$, and the switch structure 52 is configured to selectively output the boosted voltage $V_{BOOST}$ from the charge pump 50, the battery voltage $V_{BAT}$, or zero voltage to the power inductor 32.

Comparing the second tracked voltage $V_{TK2}$ from the second tracking amplifier 24 and the second modulated voltage $V_{CCB}$ at the second voltage port P2 (representing that the second offset capacitor 48 needs to be charged or discharged), the second control unit 28 may be configured to control duty cycles of the charge pump 50 to change the value of the boosted voltage $V_{BOOST}$. Typically, the boosted voltage $V_{BOOST}$ is higher than the battery voltage $V_{BAT}$. In a non-limiting example, the boosted voltage $V_{BOOST}$ may be equal to up to two times the battery voltage $V_{BAT}$ ($V_{BOOST}=2*V_{BAT}$).

The switch structure 52 is coupled between the charge pump 50 and the power inductor 32. In a non-limiting example, the switch structure 52 includes a single-pole three-throw (SP3T) switch, which is controlled to selectively connect to the charge pump 50, the battery voltage $V_{BAT}$, or ground. As such, the switch structure 52 selectively outputs the boosted voltage $V_{BOOST}$ from the charge pump 50, the battery voltage $V_{BAT}$, or zero voltage from ground to the power inductor 32. The switch structure 52 may be controlled by the second control unit 28 or other controller in the ET voltage block 12A (not shown). Notably, the switch structure 52 may be implemented by any number, type, and layout of switches without affecting functionalities of the switch structure 52.

The power inductor 32 is coupled between the switch structure 52 of the multi-level voltage converter 30 and the second voltage port P2. The voltage outputted by the switch structure 52 causes the power inductor 32 to induce an output current $I_L$ toward the second voltage port P2. As such, the second control unit 28 is configured to control (e.g., increase/decrease) the output current $I_L$ to the second voltage port P2. Herein, since the power inductor 32 may block middle and/or high frequency AC, the output current $I_L$ from the power inductor 32 may only include DC and/or low frequency AC portions (e.g., lower frequency compared to the second tracked current $I_{TK2}$). Therefore, the multi-level voltage converter 30 and the power inductor 32 may only provide low frequency power energy to the second voltage port P2. In a non-limiting example, the power inductor 32 may have an inductance of 2.2 microHenry (μH).

The LDO/switch unit 34 is coupled between the first voltage port P1 and the second voltage port P2. The LDO/switch unit 34 includes two operation modes, a LDO operation mode and a switch operation mode. In the LDO operation mode, by comparing the first tracked voltage $V_{TK1}$ from the first tracking amplifier 22 with the first modulated voltage $V_{CCA}$ at the first voltage port P1 (representing that the first offset capacitor 46 needs to be charged or discharged), the first control unit 26 is configured to increase or decrease current through the LDO/switch unit 34 from the second voltage port P2 to the first voltage port P1. In a non-limiting example, the LDO/switch unit 34 may be implemented by a transistor. A drain of the transistor is coupled to the second voltage port P2 and a source of the transistor is coupled to the first voltage port P1. By controlling the gate of the transistor (the LDO/switch unit 34), the first control unit 26 is configured to increase or decrease the current through the LDO/switch unit 34 from the second voltage port P2 to the first voltage port P1. In the switch mode, the LDO/switch unit 34 may be not controlled by the first control unit 26, but programmed as a closed switch (a transistor in a saturation state).

In one embodiment, there might be an isolation inductor 54 coupled between the second voltage port P2 and the LDO/switch unit 34. The isolation inductor 54 is configured to provide RF isolation between the first voltage port P1 and the second voltage port P2 by prevent middle and/or high frequency current transmitting from the second voltage port P2 to the first voltage port P1. The isolation inductor 54 may have an inductance between 1 nH and 10 nH. Herein, a first portion of the output current $I_L$ (through the LDO/switch unit 34 from the second voltage port P2 to the first voltage port P1) and the first tracked current $I_{TK1}$ are provided to the first voltage port P1 (the second tracked current $I_{TK2}$ may be prevented by the isolation inductor 54). A second portion of the output current $I_L$ and the second tracked current $I_{TK2}$ are provided to the second voltage port P2. Note that the multi-level voltage converter 30 and the power inductor 32 provide low frequency power energy to both the first voltage port P1 (through the LDO/switch unit 34) and the second voltage port P2. There is no extra multi-level voltage converter (charge pump) or extra power inductor included in the ET voltage block 12. Typically, the consumption area of the LDO/switch unit 34 is much smaller than the combination of the multi-level voltage converter 30 (including the charge pump 50) and the power inductor 32. Therefore, the overall size of the ET voltage block 12 is smaller than an ET voltage block with dual multi-level voltage converters (dual charge pumps) and dual power inductors.

In high frequency applications, high power output is required to compensate for high propagation losses of signals at the high frequencies. In a non-limiting example, the PA block 14 provides a dual-stage amplifier structure to provide high power output. Herein the PA block 14 includes a first stage amplifier 56, an isolation element 58, and a second stage amplifier 60 coupled in series. The PA block 14 is configured to receive the RF input signal $RF_{IN}$ (at the first stage amplifier 56), and configured to provide an amplified RF output signal $RF_{OUT}$ (from the second stage amplifier 60) to an antenna ANT. The isolation element 58 between the first stage amplifier 56 and the second stage amplifier 60 is configured to reduce RF coupling from the second stage amplifier 60 to the first stage amplifier 56, which may affect stability of the PA block 14. The first stage amplifier 56 is coupled to the first voltage port P1 via the first supply line 16 to receive the first modulated voltage $V_{CCA}$ for power supply, while the second stage amplifier 60 is coupled to the second voltage port P2 via the second supply line 18 to receive the second modulated voltage $V_{CCB}$ for power supply. In different applications, the PA block 14 may provide multi-stage amplifier structure, which includes more stage amplifiers and/or more isolation elements.

In one embodiment, the PA block 14 may further include a first choke inductor 62 coupled between the first stage amplifier 56 and the first supply line 16, and a second choke inductor 64 coupled between the second stage amplifier 60 and the second supply line 18. Herein, the first trace inductance $L_{TC1}$ of the first supply line 16, the second trace inductance $L_{TC2}$ of the second supply line 18, the first choke inductor 62, and the second choke inductor 64 may help in RF isolation between the first stage amplifier 56 and the second stage amplifier 60 (so as to enhance stability of the PA block 14) as they add up with the isolation inductor 54. Furthermore, the PA block 14 may further include a first isolation capacitor 66 and a second isolation capacitor 68. The first isolation capacitor 66 is coupled between the first choke inductor 62 and ground, and the second isolation capacitor 68 is coupled between the second choke inductor 64 and ground.

Because the first choke inductor 62 and the first supply line 16 are located between the first voltage port P1 and the first stage amplifier 56, the first modulated voltage $V_{CCA}$ cannot be fully applied to the first stage amplifier 56. A first stage supply $V_{STG1}$ received at the first stage amplifier 56 is smaller than the first modulated voltage $V_{CCA}$. There is a first voltage distortion $(L_{CHOKE1}+L_{TC1})*d(I_{L1})/dt$ over the first choke inductor 62 and the first supply line 16 (dropping from the first modulated voltage $V_{CCA}$ to the first stage supply $V_{STG1}$). Herein, $L_{CHOKE1}$ is an inductance of the first choke inductor 62, and $I_D$ is the first current portion of the output current $I_L$ (through the LDO/switch unit 34 from the second voltage port P2 to the first voltage port P1). To ensure enough power supply for the first stage amplifier 56, the first modulated voltage $V_{CCA}$ may need to be compensated for the first voltage distortion $(L_{CHOKE1}+L_{TC1})*d(I_{L1})/dt$ by the first equalizer 38 generating a voltage correction term in the first target voltage $V_{TAR1}$ (the first modulated voltage $V_{CCA}$ is an offset version of the first tracked voltage $V_{TK1}$, which is tracking the first target voltage $V_{TAR1}$).

Similarly, because the second choke inductor 64 and the second supply line 18 are located between the second voltage port P2 and the second stage amplifier 60, the second modulated voltage $V_{CCB}$ cannot be fully applied to the second stage amplifier 60. A second stage supply $V_{STG2}$ received at the second stage amplifier 60 is smaller than the second modulated voltage $V_{CCB}$. There is a second voltage distortion $(L_{CHOKE2}+L_{TC2})*d(I_{L2})/dt$ over the second choke inductor 64 and the second supply line 18 (dropping from the second modulated voltage $V_{CCB}$ to the second stage supply $V_{STG2}$). Herein, $L_{CHOKE2}$ is an inductance of the second choke inductor 64, and $I_{L2}$ is the second current portion of the output current $I_L$ through the second voltage port P2. To ensure enough power supply for the second stage amplifier 60, the second modulated voltage $V_{CCB}$ may need to be compensated for the second voltage distortion $(L_{CHOKE2}+L_{TC2})*d(I_{L2})/dt$ by the second equalizer 42 generating a voltage correction term in the second target voltage $V_{TAR2}$ (the second modulated voltage $V_{CCB}$ is an offset version of the second tracked voltage $V_{TK2}$, which is tracking the second target voltage $V_{TAR2}$).

If the first voltage distortion $(L_{CHOKE1}+L_{TC1})*d(I_{L1})/dt$ and the second voltage distortion $(L_{CHOKE2}+L_{TC2})*d(I_{L2})/dt$ are different, the first equalizer 38 and the second equalizer 42 may be adjusted for different compensations. In a non-limiting example, the second voltage distortion $(L_{CHOKE2}+L_{TC2})*d(I_{L2})/dt$ is larger than the first voltage distortion $(L_{CHOKE1}+L_{TC1})*d(I_{L1})/dt$, such that the second modulated voltage $V_{CCB}$ needs to be compensated higher than the first modulated voltage $V_{CCA}$. In addition, an amplified output provided by the first stage amplifier 56 is an input (through the isolation element 58) for the following second stage amplifier 60. Therefore, the input signal for the second stage amplifier 60 will have time delays compared to the RF input signal $RF_{IN}$ fed to the first stage amplifier 56. To enhance power efficiency, it is desirable for the power supply to be aligned in time with the input signal of a corresponding stage amplifier. The second stage supply $V_{STG2}$ for the second stage amplifier 60 may also have time delays compared to the first stage supply $V_{STG1}$ for the first stage amplifier 56, so as to match corresponding inputs of the first stage amplifier 56 and the second stage amplifier 60, respectively. Thus, besides the different compensations for the first and second voltage distortions, the first equalizer 38 and the second equalizer 42 will also adjust differently in time delays, such that the first stage supply $V_{STG1}$ will be aligned in time to the RF input signal $RF_{IN}$ fed to the first stage amplifier 56, and the second stage supply $V_{STG2}$ will be aligned in time to the input signal applied to the second stage amplifier 60.

Furthermore, the RF input signal $RF_{IN}$ fed to the first stage amplifier 56 may have a lower power level than the input signal for the second stage amplifier 60. As such, the second stage supply $V_{STG2}$ for the second stage amplifier 60 may be greater than the first stage supply $V_{STG1}$ for the first stage amplifier 56 to be aligned in amplitude with the input signal of a corresponding stage amplifier. In a non-limiting example, the first stage supply $V_{STG1}$ for the first stage amplifier 56 may range between 0.8 V-3 V, and the second stage supply $V_{STG2}$ for the second stage amplifier 60 may range between 1 V-5 V. Note that the different voltage ranges of the first stage supply $V_{STG1}$ and the second stage supply $V_{STG2}$ are programmed/determined at the split element 36 (the first split signal $V_{SPT1}$ and the second split signal $V_{SPT2}$ may already have different amplitude ranges).

Herein, the second modulated voltage $V_{CCB}$ is greater than the first modulated voltage $V_{CCA}$ (the second stage supply $V_{STG2}$ has higher amplitude than the first stage supply $V_{STG1}$ over time, and the second voltage distortion $(L_{CHOKE2}+L_{TC2})*d(I_{L2})/dt$ is larger than the first voltage distortion $(L_{CHOKE1}+L_{TC1})*d(I_{L1})/dt)$, and the second modulated voltage $V_{CCB}$ has time delays compared to the first modulated voltage $V_{CCA}$.

By providing separate modulated voltages $V_{CCA}$ and $V_{CCB}$ to different stage amplifiers 56 and 60 in the PA block 14, the amplitude distortion, phase distortion, linearity, and/or power efficiency of the PA block 14 may improve compared to the PA block 14 with a single power supply. Note that the second modulated voltage $V_{CCB}$ is always greater than or equal to the first modulated voltage $V_{CCA}$ over time, so as to avoid reverse current flow in the LDO/switch unit 34 and make it possible to utilize the ET voltage block 12 with the single multi-level voltage converter 30 and the single power inductor 32.

Figure 2:
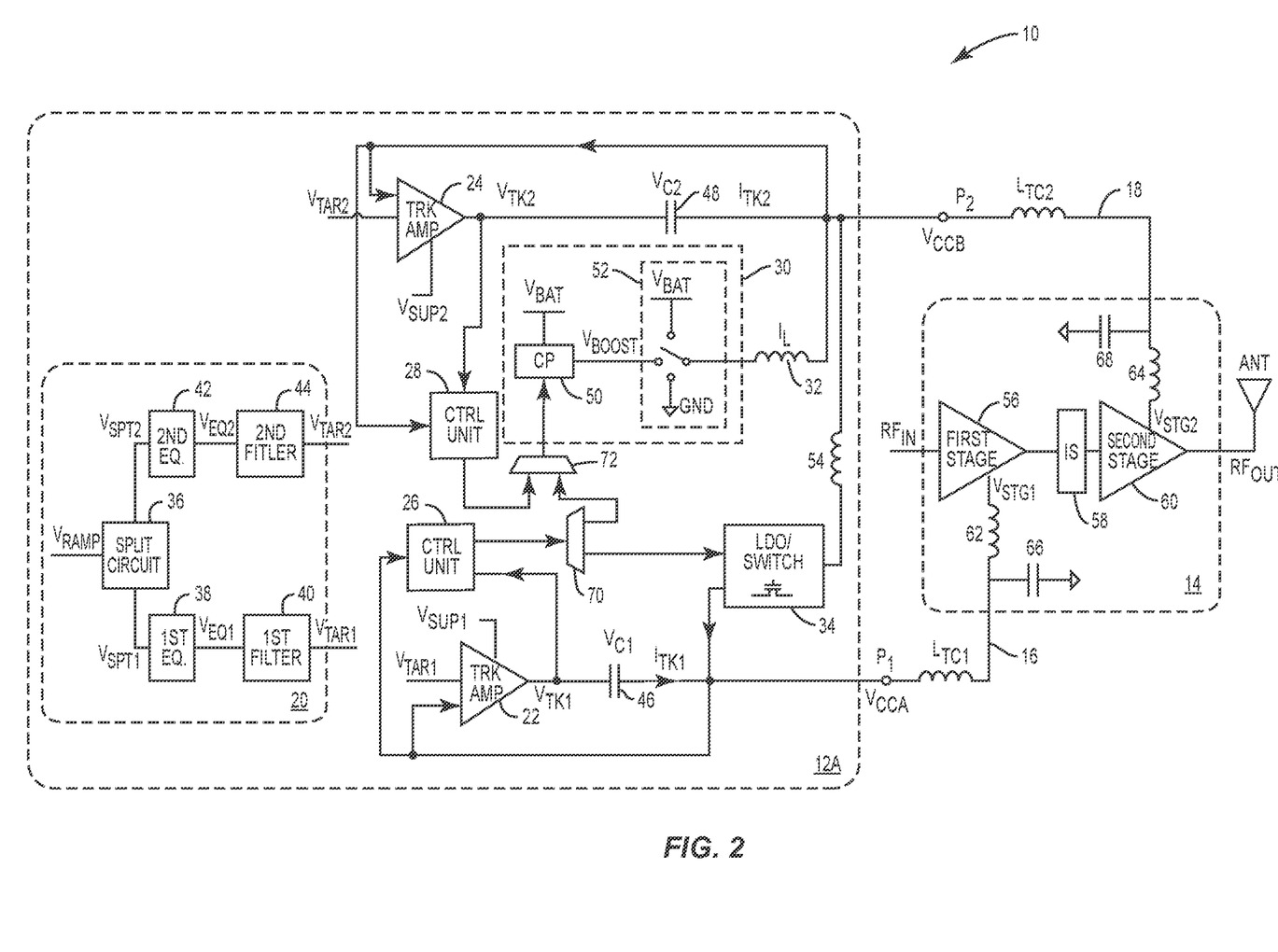
FIG. 2 illustrates a first alternative ET amplification architecture according to one embodiment of the present disclosure.

FIG. 2 provides a first alternative ET voltage block 12A within the ET amplification architecture 10 according to one embodiment of the present disclosure. Compared to the ET voltage block 12 of FIG. 1, the first alternative ET voltage block 12A additionally includes a demultiplexer (DEMUX) 70 and a multiplexer (MUX) 72. The DEMUX 70 is coupled between the first control unit 26 and the LDO/switch unit 34, while the MUX 72 is coupled between the second control unit 28 and the charge pump 50. The DEMUX 70 is configured to receive a first control signal from the first control unit 26, and configured to provide the first control signal either to the LDO/switch unit 34 or to the MUX 72. The MUX 72 is configured to receive either the first control signal from the DEMUX 70 or a second control signal from the second control unit 28, and configured to provide the received control signal to the charge pump 50. Herein, when the first control unit 26 controls the LDO/switch unit 34 via the DEMUX 70 (no first control signal passes to the MUX 72) and the second control unit 28 controls the charge pump 50 via MUX 72, the first alternative ET voltage block 12A functions the same as the ET voltage block 12 of FIG. 1.

Figure 3A:
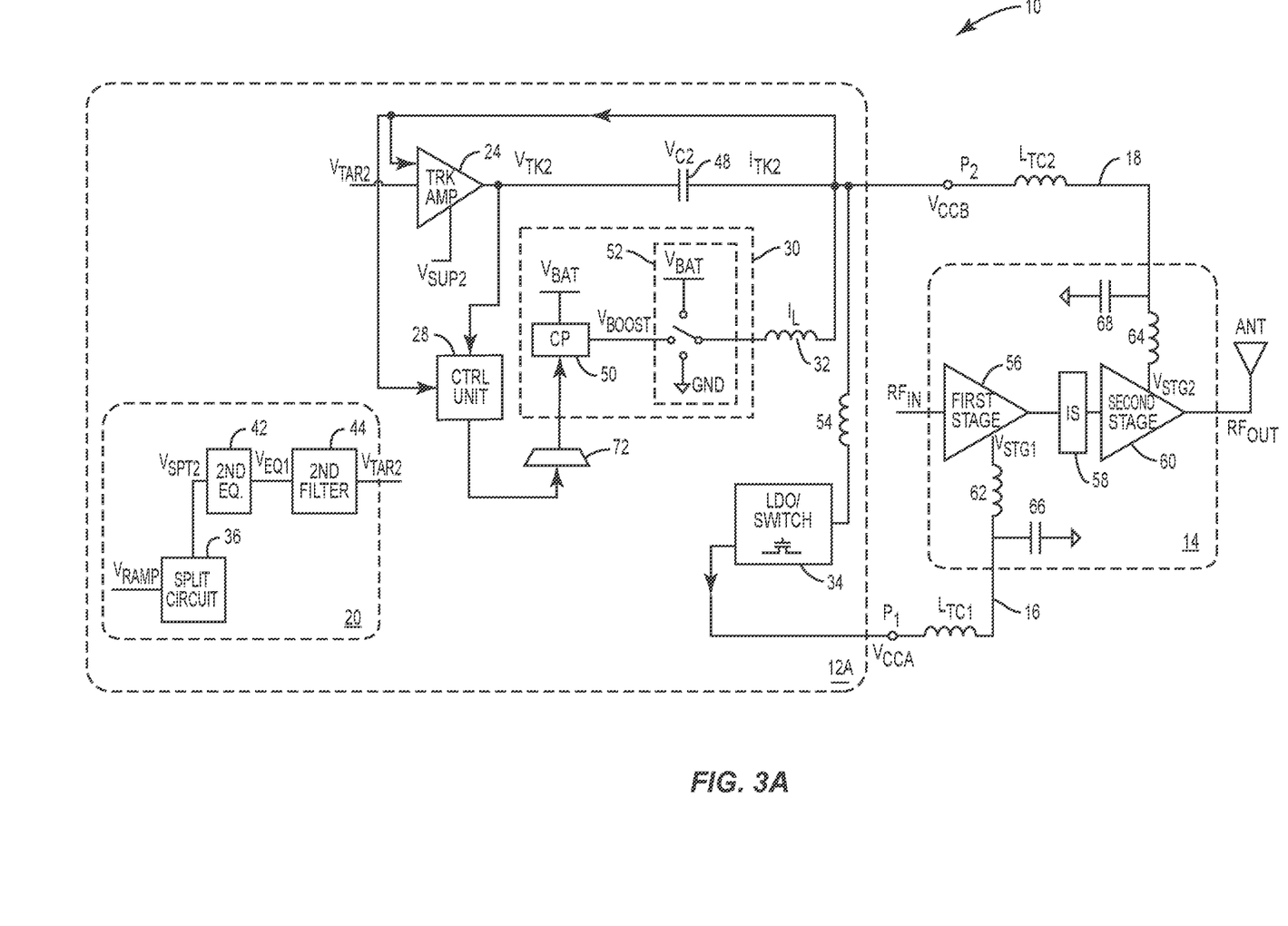
FIGS. 3A and 3B provide an enabled configuration of the first alternative ET amplification architecture shown in FIG. 2.
Figure 3B:
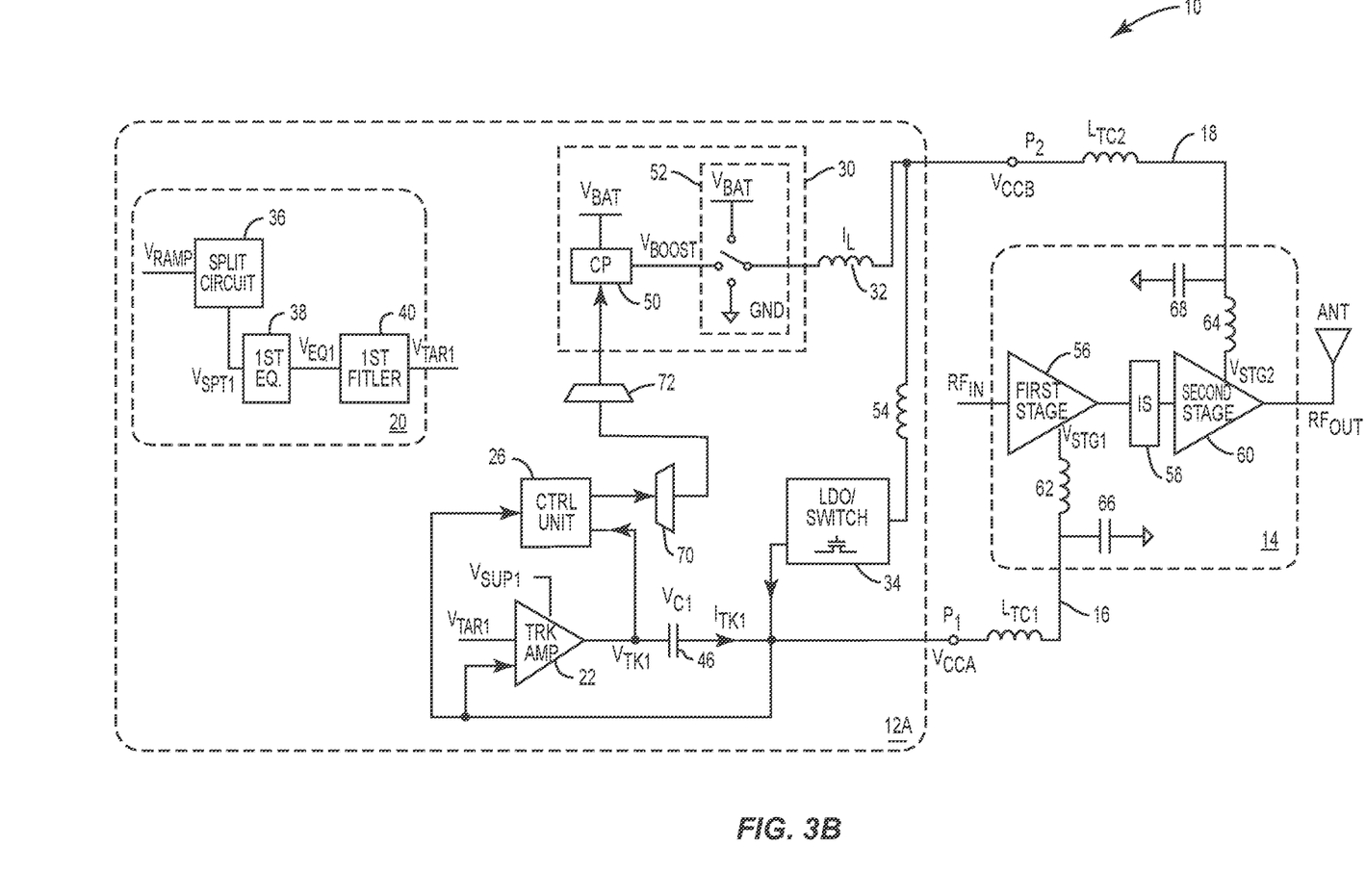

In some applications, especially when the ET amplification architecture 10 operates with low bandwidth (e.g 5 MHz to 50 MHz), the PA block 14 may accept identical modulated voltages $V_{CCB}$ and $V_{CCA}$ for the first stage amplifier 56 and the second stage amplifier 60, respectively. As such, there might be no need for two different target voltages, and no need to enable both the tracking amplifiers 22 and 24. FIGS. 3A and 3B provide an enabled configuration of the first alternative ET voltage block 12A within the ET amplification architecture 10 for identical modulated voltages.

In one exemplary case, as shown in FIG. 3A, the second tracking amplifier 24 is enabled, while the first tracking amplifier 22 is disabled (not shown in FIG. 3A). The first control unit 26, the first offset capacitor 46, and the DEMUX 70 do not operate (not shown in FIG. 3A) due to the disabled first tracking amplifier 22 (not shown in FIG. 3A). In consequence, the MUX 72 will not receive any signal from the DEMUX 70. The second tracking amplifier 24, the second control unit 28, the multi-level voltage converter 30, the power inductor 32, and the second offset capacitor 48 may operate the same as described above. The LDO/switch unit 34 may be programmed as a closed switch (a transistor in saturation state). Thus, the first modulated voltage $V_{CCA}$ and the second modulated voltage $V_{CCB}$ are identical. Herein, there might be no first target voltage $V_{TAR1}$ generated by the signal processing unit 20. The first equalizer 38 and the first AAF 40 may also be disabled (not shown in FIG. 3A).

In another exemplary case, as shown in FIG. 3B, the first tracking amplifier 22 is enabled, while the second tracking amplifier 24 is disabled (not shown in FIG. 3B). Herein, the second control unit 28 and the second offset capacitor 48 do not operate (not shown in FIG. 3B) due to the disabled second tracking amplifier 24 (not shown in FIG. 3B). Therefore, the MUX 72 will not receive any signal from the second control unit 28. In this case, the first tracking amplifier 22 and the first offset capacitor 46 may operate the same as described above, and the DEMUX 70 is configured to pass the first control signal from the first control unit 26 to the charge pump 50 (via the MUX 72). By comparing the first tracked voltage $V_{TK1}$ from the first tracking amplifier 22 and the first modulated voltage $V_{CCA}$ at the first voltage port P1 (representing that the first offset capacitor 46 needs to be charged or discharged), the first control unit 26 is configured to control duty cycles of the charge pump 50 to change the value of the boosted voltage $V_{BOOST}$. In addition, the first control unit 26 may also be configured to control the switch structure 52 to selectively output the boosted voltage $V_{BOOST}$ from the charge pump 50, the battery voltage $V_{BAT}$, or zero voltage from ground to the power inductor 32. The LDO/switch unit 34 is programmed as a closed switch (a transistor in saturation state). Thus, the first modulated voltage $V_{CCA}$ and the second modulated voltage $V_{CCB}$ are identical. Herein, there might be no second target voltage $V_{TAR2}$ generated by the signal processing unit 20. The second equalizer 42 and the second AAF 44 may also be disabled (not shown in FIG. 3B).

Figure 4:
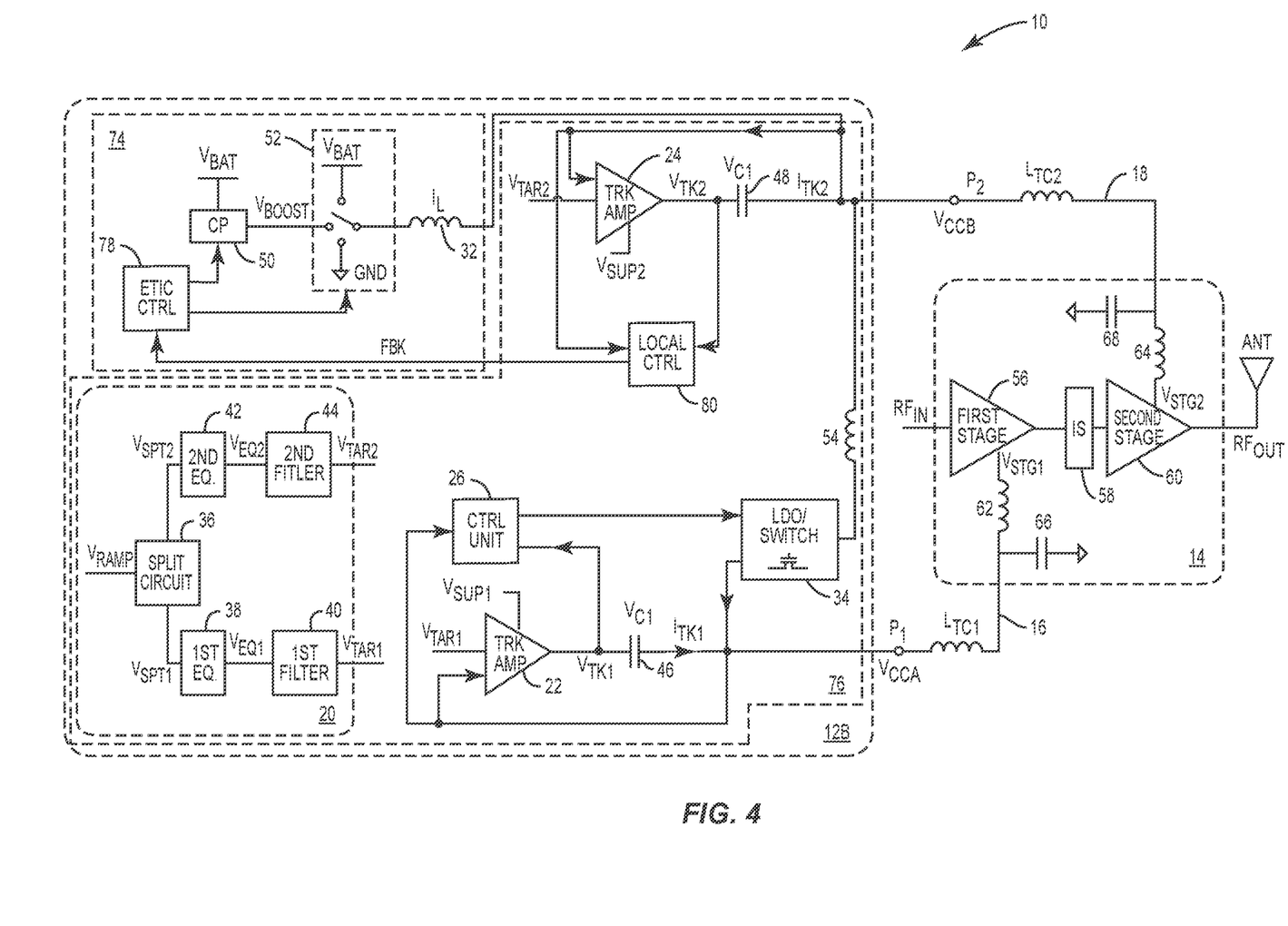
FIG. 4 illustrates a second alternative ET amplification architecture according to one embodiment of the present disclosure.

FIG. 4 provides a second alternative ET voltage block 12B within the ET amplification architecture 10 according to one embodiment of the present disclosure. The second alternative ET voltage block 12B differs from the ET voltage block 12 of FIG. 1 in that the charge pump 50, the switch structure 52, and the power inductor 32, which are used to provide DC current, are disposed farther away from the PA block 14. The other components, which are used to provide AC current (such as the first tracking amplifier 22 and the second tracking amplifier 24), are disposed close to the PA block 14. As such, the first supply line 16 and the second supply line 18 may shrink in length, and the inherently first trace inductance $L_{TC1}$ and the inherently second trace inductance $L_{TC2}$ may reduce their values.

More specifically, the alternative ET voltage block 12B is architected with an ET integrated circuit (ETIC) unit 74 away from the PA block 14 and a displaced amplifier (DA) unit 76 close to the PA block 14. The ETIC unit 74 includes the charge pump 50, the switch structure 52, the power inductor 32, and an ETIC control element 78. The DA unit 76 includes the signal processing unit 20, the first tracking amplifier 22, the second tracking amplifier 24, the first control unit 26, the LDO/switch unit 34, the first offset capacitor 46, the second offset capacitor 48, the isolation inductor 54, and a local DA control element 80.

Herein, the signal processing unit 20, the first tracking amplifier 22, the second tracking amplifier 24, the first control unit 26, the LDO/switch unit 34, the first offset capacitor 46, the second offset capacitor 48, and the isolation inductor 54 may operate the same as described above. The local DA control element 80 is configured to communicate with the ETIC control element 78. By comparing the second tracked voltage $V_{TK2}$ from the second tracking amplifier 24 and the second modulated voltage $V_{CCB}$ at the second voltage port P2 (representing that the second offset capacitor 48 needs to be charged or discharged), the local DA control element 80 is configured to provide a single analog feedback signal FBK to the ETIC control element 78. Based on the feedback signal FBK, the ETIC control element 78 is configured to control duty cycles of the charge pump 50 to change the value of the boosted voltage $V_{BOOST}$. In addition, the ETIC control element 78 may also be configured to control the switch structure 52, so as to selectively connect to the charge pump 50, the battery voltage $V_{BAT}$, or ground. The switch structure 52 selectively outputs the boosted voltage $V_{BOOST}$ from the charge pump 50, the battery voltage $V_{BAT}$, or zero voltage from ground to the power inductor 32. The voltage outputted by the switch structure 52 causes the power inductor 32 to induce the output current $I_L$ toward the second voltage port P2. A combination of the ETIC control element 78 and the local DA control element 80 functions as the second control unit 28 in the ET voltage block 12 shown in FIG. 1.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a signal processing unit configured to generate a first target voltage and a second target voltage from one pulsed ramp signal;
   a first tracking amplifier coupled to a first voltage port and configured to generate a first tracked voltage based on the first target voltage, wherein a first modulated voltage at the first voltage port is related to the first tracked voltage;
   a second tracking amplifier coupled to a second voltage port and configured to generate a second tracked voltage based on the second target voltage, wherein a second modulated voltage at the second voltage port is related to the second tracked voltage; and
   a power amplifier (PA) block coupled to the first voltage port and the second voltage port to receive the first modulated voltage and the second modulated voltage, respectively, wherein:
   the second modulated voltage is not smaller than the first modulated voltage over time; and
   the signal processing unit is configured to generate the first target voltage and the second target voltage based on a configuration of the PA block.

2. The apparatus of claim 1 wherein the PA block is configured to amplify a radio frequency (RF) input signal and provide an RF output signal, wherein:
   the pulsed ramp signal contains envelope information of the RF input signal;
   the PA block includes a first stage amplifier and a second stage amplifier coupled in series, such that the first stage amplifier is configured to receive the RF input signal, and the second stage amplifier is configured to provide the RF output signal; and
   the first stage amplifier is coupled to the first voltage port via a first supply line to receive the first modulated voltage for power supply, while the second stage amplifier is coupled to the second voltage port via a second supply line to receive the second modulated voltage for power supply.

3. The apparatus of claim 2 wherein the PA block further includes an isolation element coupled between the first stage amplifier and the second stage amplifier, wherein the isolation element is configured to reduce RF coupling from the second stage amplifier to the first stage amplifier.

4. The apparatus of claim 2 wherein the PA block further includes a first choke inductor and a second choke inductor, wherein:
   the first choke inductor is coupled between the first stage amplifier and the first supply line, such that the first modulated voltage drops a first voltage distortion over the first choke inductor and the first supply line;
   the second choke inductor is coupled between the second stage amplifier and the second supply line, such that the second modulated voltage drops a second voltage distortion over the second choke inductor and the second supply line; and
   the signal processing unit is configured to generate the first target voltage to compensate the first voltage distortion from the first modulated voltage, and configured to generate the second target voltage to compensate the second voltage distortion from the second modulated voltage.

5. The apparatus of claim 4 wherein the signal processing unit includes a split element, a first equalizer, and a second equalizer, wherein:

the split element is configured to split the pulsed ramp signal into a first split signal and a second split signal, wherein the first split signal and the second split signal are eligible to have different amplitude ranges;

the first equalizer is configured to adjust the first split signal to provide a first equalized signal, wherein the first target voltage is based on the first equalized signal that is adjusted to compensate the first voltage distortion from the first modulated voltage; and the second equalizer is configured to adjust the second split signal to provide a second equalized signal, wherein the second target voltage is based on the second equalized signal that is adjusted to compensate the second voltage distortion from the second modulated voltage.

6. The apparatus of claim 1 wherein the signal processing unit includes a split element, a first equalizer, and a second equalizer, wherein:

the split element is configured to split the pulsed ramp signal into a first split signal and a second split signal, wherein the first split signal and the second split signal are eligible to have different amplitude ranges;

the first equalizer is configured to adjust the first split signal based on the configuration of the PA block to provide a first equalized signal, wherein the first target voltage is based on the first equalized signal;

the second equalizer is configured to adjust the second split signal based on the configuration of the PA block to provide a second equalized signal, wherein the second target voltage is based on the second equalized signal; and the first target voltage and the second target voltage are eligible to have at least one of a time delay difference, an amplitude difference, and a phase difference.

7. The apparatus of claim 6 wherein the signal processing unit further includes a first anti-aliasing filter (AAF) coupled to the first equalizer and a second AAF coupled to the second equalizer, wherein the first AAF is configured to low-pass filter the first equalized signal to provide the first target voltage, and the second AAF is configured to low-pass filter the second equalized signal to provide the second target voltage.

8. The apparatus of claim 1 further comprising:

a multi-level voltage converter comprising a charge pump that is configured to receive a battery voltage and generate a boosted voltage higher than the battery voltage, wherein an output current based on the boosted voltage is induced; and a low-dropout (LDO)/switch unit coupled between the first voltage port and the second voltage port, wherein a first portion of the output current is eligible to flow through the LDO/switch unit from the second voltage port to the first voltage port, and a second portion of the output current is eligible to flow towards the second voltage port.

9. The apparatus of claim 8 further comprising an isolation inductor coupled between the second voltage port and the LDO/switch unit, wherein the isolation inductor is configured to provide RF isolation between the first voltage port and the second voltage port.

10. The apparatus of claim 8 further comprising a power inductor coupled between the multi-level voltage converter and the second voltage port, wherein the power inductor is configured to induce the output current based on the boosted voltage.

11. The apparatus of claim 10 further comprising a first control unit and a second control unit, wherein:

the second control unit is configured to control the multi-level voltage converter to increase or decrease the output current; and the first control unit is configured to control the LDO/switch unit to increase or decrease the first portion of the output current from the second voltage port to the first voltage port.

12. The apparatus of claim 11 wherein the LDO/switch unit is implemented by a transistor, wherein:

a drain of the transistor is coupled to the second voltage port;

a source of the transistor is coupled to the first voltage port; and the first control unit is configured to control a gate of the transistor to increase or decrease the first portion of the output current from the second voltage port to the first voltage port.

13. The apparatus of claim 11 wherein:

the first control unit is one of a group consisting of a microprocessor, a microcontroller, a digital signal processor (DSP), and a field programmable gate array (FPGA); and the second control unit is one of a group consisting of a microprocessor, a microcontroller, a DSP, and a FPGA.

14. The apparatus of claim 11 wherein:

the first tracking amplifier is coupled to the first voltage port via a first offset capacitor;

the second tracking amplifier is coupled to the second voltage port via a second offset capacitor;

the first modulated voltage at the first voltage port is equal to the first tracked voltage generated by the first tracking amplifier and a first offset voltage across the first offset capacitor; and the second modulated voltage at the second voltage port is equal to the second tracked voltage generated by the second tracking amplifier and a second offset voltage across the second offset capacitor.

15. The apparatus of claim 14, wherein:

the second control unit is configured to control the charge pump by comparing the second tracked voltage from the second tracking amplifier and the second modulated voltage at the second voltage port; and the first control unit is configured to control the LDO/switch unit by comparing the first tracked voltage from the first tracking amplifier and the first modulated voltage at the first voltage port.

16. The apparatus of claim 11 wherein the multi-level voltage converter further comprises a switch structure coupled between the charge pump and the power inductor, wherein:

the second control unit is configured to control duty cycles of the charge pump in the multi-level voltage converter to change a value of the boosted voltage; and the switch structure is controlled by the second control unit to selectively output the boosted voltage from the charge pump, the battery voltage, or zero voltage from ground to the power inductor, so as to control the output current towards the second voltage port.

17. The apparatus of claim 11 further comprising:

a demultiplexer (DEWUX) coupled between the first control unit and the LDO/switch unit; and a multiplexer (MUX) coupled between the second control unit and the charge pump, wherein:

the DEMUX is configured to receive a first control signal from the first control unit, and configured to provide the first control signal either to the LDO/switch unit or to the MUX; and the MUX is configured to receive either the first control signal from the DEMUX or a second control signal from the second control unit, and configured to provide the received control signal to the charge pump.

18. The apparatus of claim 8 wherein the boosted voltage is equal to two times the battery voltage.

19. An apparatus comprising:
a displaced amplifier (DA) unit, which includes a signal processing unit, a first tracking amplifier, a second tracking amplifier, and a low-dropout (LDO)/switch, wherein:
the signal processing unit is configured to generate a first target voltage and a second target voltage from one pulsed ramp signal;
the first tracking amplifier is coupled to a first voltage port and configured to generate a first tracked voltage based on the first target voltage, wherein a first modulated voltage at the first voltage port is related to the first tracked voltage;
the second tracking amplifier is coupled to a second voltage port and configured to generate a second tracked voltage based on the second target voltage, wherein a second modulated voltage at the second voltage port is related to the second tracked voltage; and
the LDO/switch unit is coupled between the first voltage port and the second voltage port;
an envelope tracking integrated circuit (ETIC) unit with a charge pump that is configured to receive a battery voltage and generate a boosted voltage higher than the battery voltage, wherein an output current based on the boosted voltage is induced, a first portion of the output current is eligible to flow through the LDO/switch unit from the second voltage port to the first voltage port, and a second portion of the output current is eligible to flow toward the second voltage port; and
a power amplifier (PA) block coupled to the first voltage port to receive the first modulated voltage, and coupled to the second voltage port to receive the second modulated voltage, wherein:
the second tracking amplifier of the DA unit is disposed close to the PA block, while the ETIC unit is disposed away from the PA block;
the second modulated voltage is not smaller than the first modulated voltage over time; and
the signal processing unit is configured to generate the first target voltage and the second target voltage based on a configuration of the PA block.

20. The apparatus of claim 19 wherein:
the DA unit further includes a local DA control element; and
the ETIC unit further includes an ETIC control element, wherein:
the local DA control element is configured to provide a feedback signal to the ETIC control element by comparing the first tracked voltage with the first modulated voltage; and
the ETIC control element is configured to control duty cycles of the charge pump to change a value of the boosted voltage based on the feedback signal from the local DA control element.

* * * * *

UNITED STATES PATENT AND TRADEMARK OFFICE
CERTIFICATE OF CORRECTION

PATENT NO. : 10,862,431 B1  
APPLICATION NO. : 16/804580  
DATED : December 8, 2020  
INVENTOR(S) : Nadim Khlat Page 1 of 1

It is certified that error appears in the above-identified patent and that said Letters Patent is hereby corrected as shown below:

In the Specification

At Column 12, Line 35, replace "$I_D$" with --$I_{L1}$--.

In the Claims

In Claim 17, Column 18, Line 60, replace "(DEWUX)" with --(DEMUX)--.

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*